United States Patent [19]
Harmel et al.

[11] Patent Number: 5,410,177
[45] Date of Patent: Apr. 25, 1995

[54] PLANAR SEMICONDUCTOR AND ZENER DIODE DEVICE WITH CHANNEL STOPPER REGION

[75] Inventors: Hartmut Harmel, Hofgeismar; Lennart Ryman, Heilbronn, both of Germany

[73] Assignee: Temic Telefunken Microelectronic GmbH, Heilbronn, Germany

[21] Appl. No.: 100,409

[22] Filed: Aug. 2, 1993

[30] Foreign Application Priority Data

Sep. 23, 1992 [DE] Germany .................. 42 31 829.7

[51] Int. Cl.⁶ .................. H01L 29/40; H01L 33/00
[52] U.S. Cl. .................. 257/567; 257/566
[58] Field of Search .................. 257/567, 566

[56] References Cited

U.S. PATENT DOCUMENTS

| | | | |
|---|---|---|---|
| 4,618,875 | 10/1986 | Flohrs | 307/315 |
| 5,172,209 | 12/1992 | Chang | 257/567 |

FOREIGN PATENT DOCUMENTS

| | | |
|---|---|---|
| 0106195A2 | 4/1984 | European Pat. Off. . |
| 1564863 | 12/1969 | Germany . |
| 3227536A1 | 7/1983 | Germany . |
| 59-031059 | 2/1984 | Japan . |
| 62-076673 | 4/1987 | Japan . |
| 62-299076 | 12/1987 | Japan . |
| 85/05497 | 12/1985 | WIPO . |

*Primary Examiner*—Andrew J. James
*Assistant Examiner*—Stephen D. Meier
*Attorney, Agent, or Firm*—Spencer, Frank & Schneider

[57] ABSTRACT

A planar semiconductor device having a heavily doped channel stopper region of the first conductivity type and at least the following components: a Zener diode having the following regions, seen from an upper surface of the device, an upper diode region of the second conductivity type, a lightly doped first upper component region, of the first conductivity type, in which the upper diode region and the channel stopper region are formed at the upper surface, and a heavily doped lower component region of the first conductivity type; and a component having a second upper component region formed with the upper diode region in the first upper component region at the upper surface and having the same conductivity type as the upper diode region, the first upper component region, the lower component region, and a third upper component region of the first conductivity type and formed in the second upper component region at the upper surface of the device. The channel stopper region is formed adjacent to the upper diode region. A semiconductor region extending between the upper diode region and the channel stopper region has at least one of a length and a specific resistance which is dimensioned, relative to a length and a specific resistance of a semiconductor region between the upper diode region and the lower component region, such that a charge carrier breakdown of the Zener diode takes place between the upper diode region and the channel stopper region.

7 Claims, 7 Drawing Sheets

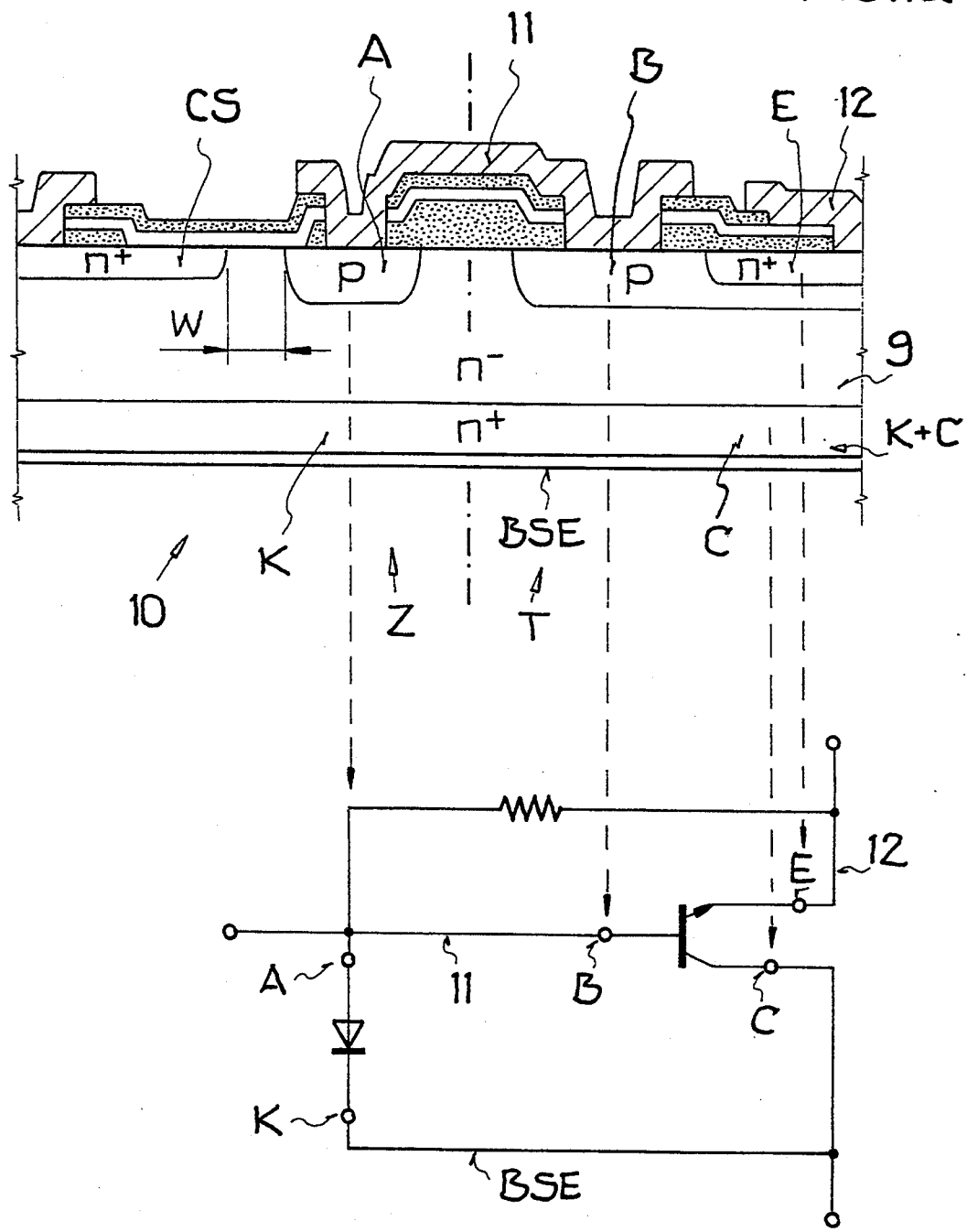

5,410,177

PLANAR SEMICONDUCTOR AND ZENER DIODE DEVICE WITH CHANNEL STOPPER REGION

BACKGROUND OF THE INVENTION

The invention relates to a planar semiconductor device or component having at least one Zener (Z)-diode and at least one further semiconductor component. The invention is of particular interest for a semiconductor device or component having two power transistors connected to one another in the form of a Darlington circuit and having a Z-diode connected between the collector and the base of one of the two transistors.

In a $p^+ n^- n^+$ diode, the breakdown voltage depends on the doping concentration in the $n^-$ region and on the distance between the $p^+$ and the $n^+$ regions. Quantitative correlations are explained in, for example, "Physics of Semiconductor Devices" by S. M. Sze, 2nd edition, 1981, John Wiley & Sons, and illustrated therein in a graph on page 105. At a distance of 20 μm and with a doping concentration of up to about $7 \times 10^{14}$ cm$^{-3}$ the breakdown voltage is about 400 V; as the doping concentration increases, the voltage decreases more and more. When the doping concentration is constant, for example about $10^-$cm$^{-3}$, the breakdown voltage rises as the magnitude of the stated distance increases, and is, for example, about 250 V at a 10 μm distance and about 1000 V at around 50 μm distance.

The assignee of this application has for more than ten years now been selling a semiconductor component under the name of BUX 30 AV, comprising a Darlington circuit with integrated Z diode between collector and base of one of the two power transistors in the Darlington circuit. The breakdown voltage of the Z diode is determined by a structure using the punch-through effect. The voltage is here determined by the doping of a $p^-$ layer and the depth of an $n^+$ layer adjoining the former layer. The fact that the depth of the $n^+$ layer cannot be adjusted with very high precision means that the breakdown voltage is subject to a relatively high tolerance. A further drawback is that the $p^-$ layer must be generated separately.

A planar semiconductor component with a similar function to that described above, but without a Z diode, is described in EP-B-0 179 099. In the upper part of the component, a channel stopper region and the base regions of two power transistors of the Darlington circuit are provided. A charge carrier breakdown takes place between one of the base regions and the common collector region.

For most applications of planar semiconductor components with preset breakdown voltage of several 100 V, it is desirable for the breakdown voltage to be subject to as minor as possible production fluctuations. The distance determining the breakdown voltage, between the anode region or base region on the one hand and the cathode/collector region on the other hand, can however only be set with wider tolerances than those permissible for the breakdown voltage. Alignment is therefore always necessary. In the case of the component in accordance with EP-B-0 179 099, this alignment is achieved with the aid of a special field plate device.

The above shows that the requirement was expressed to provide a planar semiconductor component designed such that the breakdown voltage can be adjusted simply with low production tolerances.

SUMMARY OF THE INVENTION

The planar semiconductor device in accordance with the invention has a heavily doped channel stopper region of the first conductivity type and at least the following components:
  a Zener diode having the following regions, seen from the upper surface of the device:
    an upper diode region of the second conductivity type;
    a lightly doped first upper component region of the first conductivity type, in which the upper diode region and the channel stopper region are formed; and
    a heavily doped lower component region of the first conductivity type; and
  a component having
    a second upper component region, formed with the upper diode region in the first upper component region and having the same conductivity type as the upper diode region;
    the first upper component region;
    the lower component region and
    a third upper component region of substantially the same conductivity and conductivity type as the channel stopper region formed in the second upper component region at the upper surface of the device; and
  where in the channel stopper region is formed adjacent to the upper diode region, and the length and/or specific resistance of the semiconductor region between the upper diode region and channel stopper region and of the semiconductor region between the upper diode region and lower component region are so designed that the charge carrier breakdown of the Zener diode takes place between the upper diode region and the channel stopper region.

To make clear the advantages of this component, it must initially be assumed that the component provided besides the Z diode is a power transistor in a Darlington circuit, i.e. that it is a semiconductor component having the function of he known component BUX 30 AV. However, the breakdown voltage is no longer adjusted by doping of a $p^-$ layer and the depth of an $n^+$ layer, but by the distance between the anode region and the channel stopper region and/or by doping close to the surface in the area between those regions. The latter distance or the close-to-surface doping can be adjusted with considerably greater precision than the depth of an $n^+$ layer. In addition, adjustment of the breakdown voltage solely by means of the distance between anode and channel stopper has the advantage that only production steps are taken that are already necessary for manufacture of the transistor. The Z diode can therefore be produced with very precisely adjustable breakdown voltage without particular production expenditure. If the breakdown voltage is set solely or additionally by close-to-surface doping between the anode and the channel stopper, an additional process step does become necessary, but only one not requiring particular structuring tolerances.

If, instead of at least one transistor, a different component is to be manufactured having at least one region made to match the anode region of a Z diode, and at least one region that can be manufactured together with a channel stopper region, the aforementioned advantages are achieved in a completely corresponding way.

An example of a component of this type is a thyristor, having a p-n-p-n region sequence, instead of an n-p-n sequence like the stated transistor.

It should be pointed out that the Z diode and the further component do not necessarily have to be combined monolithically. The Z diode can, for example, also be connected from the outside and separately from at least one further component.

To achieve a breakdown voltage dependent as little as possible on production fluctuations, it is also of advantage to cover the semiconductor surface directly in the section between the upper diode region and the channel stopper region by SIPOS passivation. Fewer dispersions occur here than when an $SiO_2$ covering is used, and no instabilities occur (no junction walk-out).

As mentioned at the outset, the breakdown voltage depends not only on the distance between the two regions between which the breakdown actually takes place, but also on the doping concentration, i.e. on the specific resistance in the stated region. The condition that a breakdown must take place between the anode region and the channel stopper region, and not between the anode region and the cathode region, can accordingly be fulfilled not only by selecting the distance between the first two regions mentioned narrower than that between the two latter regions, but also by selecting the specific resistance of the semiconductor region between the first two regions lower than that of the semiconductor region between the two latter ones. This measure too can be achieved with a very low production tolerance, since it affects the doping concentration in a very thin semiconductor region directly underneath the surface of the component.

The invention is described in detail in the following on the basis of the embodiments shown in figures.

BRIEF DESCRIPTION OF THE DRAWINGS

FIGS. 1a and 1b are, respectively, a diagrammatic partial cross-section view through a planar semiconductor component having a Z diode and a transistor, and the associated circuit diagram for this planar semiconductor component.

FIGS. 2a to 2h are diagrammatic partial cross-sections for illustration of a process for producing the planar semiconductor component in accordance with FIG. 1a.

DESCRIPTION OF THE PREFERRED EMBODIMENTS

Figure 2A:
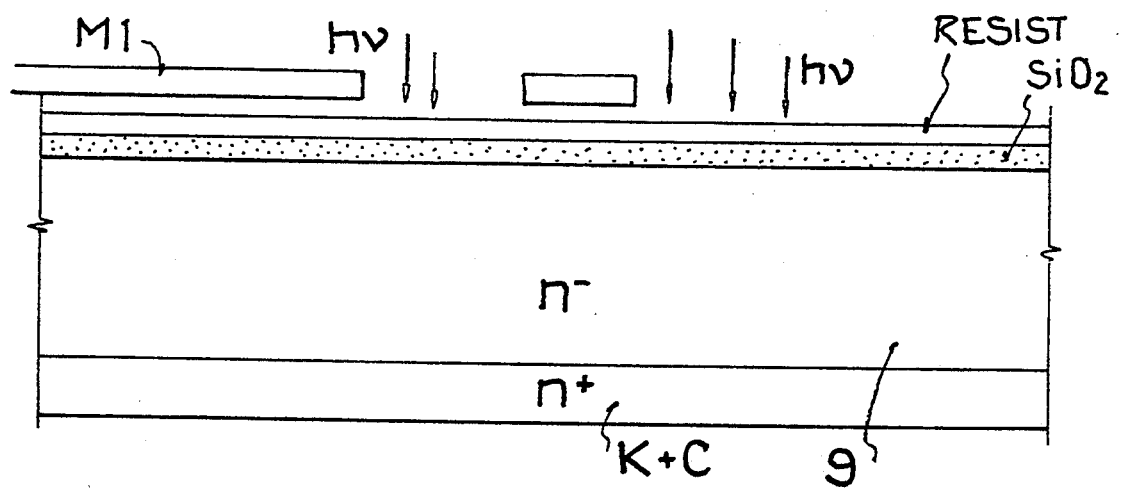
Figure 2B:
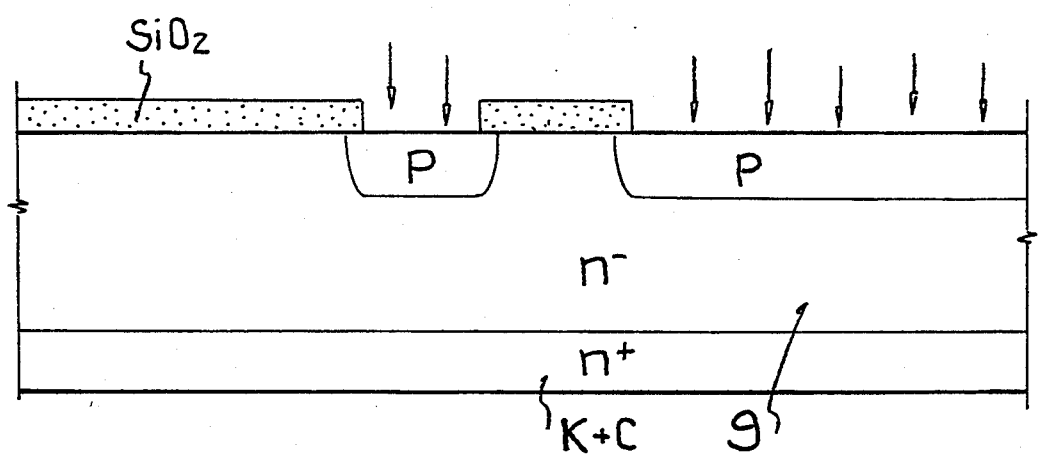

The planar semiconductor component 10 shown in FIG. 1a in a diagrammatic partial cross-section has a Z diode Z in the left-hand part and a transistor T in the right-hand part. The connection between the diode and the transistor is shown in FIG. 1b. In FIG. 1b, the anode of the Z diode is designated as A and its cathode as K. The base of the transistor is identified as B, the collector as C and the emitter as E. The appropriate letters are used in the sectional view in FIG. 1a. The resistor shown in FIG. 1b is not discernible in the section in FIG. 1a; apart from this resistor, further resistors may also be provided.

The semiconductor device or component 10 has an upper component region 9 made of $n^-$ Si and a lower component region K+C of $n^+$ Si, acting as cathode K of the Z diode Z and as the collector C of transistor T. The lower component region K+C is covered by its back surface electrode BSE, which consists, for example, of the layer sequence Cr-Ni-Au.

In the upper component region 9, an $n^+$ channel stopper region CS, a p anode region A and a p base region B are formed adjacent to one another from left to right at the upper surface (face) of the component or device 10. An $n^+$ emitter region E is diffused into the base region B from the upper face of the component. Sections of the upper surface are covered by an $SiO_2$ insulating layer and a SIPOS passivation layer, the latter comprising a lower O (oxygen-doped) SIPOS (Semi-Insulating POlycrystalline Silicon) layer and an upper N (nitrogen-doped) SIPOS layer. In the section between the channel stopper region CS and the anode region A, the SIPOS passivation layer is directly on the surface of the upper component region 9. The conductivity of the lower O-SIPOS layer ensures rapid charge equalization at the component surface during breakdown, thereby ensuring a stable breakdown voltage. The uncovered parts of the surface have electrodes as contacts, namely an anode/base electrode 11 and an emitter electrode 12.

A method for manufacture of the component in accordance with FIG. 1a is now described on the basis of FIG. 2.

The starting point is a commercially available $n^-$ substrate Si with $n^+$ back surface doping. The $n^-$ region is the upper component region 9, while the $n^+$-doped layer represents the lower component region K+C. This initial material is thermally oxidized, so that an $SiO_2$ layer is obtained, onto which a positive photoresist is then deposited. This is then exposed, through a mask M1, at those points (FIG. 2a) at which the anode and the base are to be manufactured by p doping. After development of the photoresist and etching of the $SiO_2$ layer at the developed points, p doping is carried out by means of ion implantation of boron (FIG. 2b) up to a concentration of approx. $5 \cdot 10^{17}$ to approx. $2 \cdot 10^{18}$ cm$^{-3}$. $SiO_2$ is then again thermally grown during the necessary subsequent diffusion as shown in FIG. 2c. A positive photoresist is deposited on the $SiO_2$ layer. Exposure now takes place (FIG. 2c) through a mask M2 at those points at which the channel stopper region and the emitter region are to be provided. After development of the photoresist and etching away of the $SiO_2$ layer at the developed points, $n^+$ doping is achieved by depositing phosphorus on the uncovered points of the semiconductor surface and then thermally diffusing it (FIG. 2d). The phosphorus is deposited by, for example, conveying $POCl_3$ with the aid of a carrier gas, e.g. $N_2$, over the component which is at approx. 1100° C. (FIG. 2d). Thermal diffusion of the phosphorus again results in an SiO$_2$ layer growing over the entire component as shown in FIG. 2e.

The SiO$_2$ layer just described is again covered with a positive photoresist, which is then exposed through a mask M3 (FIG. 2e) where the SiO$_2$ layer is to be removed, so that a SIPOS passivation layer can be deposited directly onto the semiconductor surface. This is particularly necessary in the section between the channel stopper region CS and the anode region A. If the channel stopper region has to be provided with contacts for whatever reason, the SiO$_2$ layer is left in the affected region for the reason set forth in connection with FIG. 2f. After development of the photoresist exposed in step 2e, and the removal of the desired portion of the S$_i$O$_2$ layer, the SIPOS passivation layer is deposited (step 2f). To do so, SiH$_4$ is passed over the component, which is at 600°-640° C., with the aid of a carrier gas, e.g. N$_2$. The gas mixture has N$_2$O added in a quantity sufficient to achieve oxygen doping of about 10 to 20 atom %. This creates semi-insulating polycrystalline or amorphous silicon. When an O-SIPOS layer with a thickness of 0.5 μm is deposited in this manner, the gas mixture has NH$_3$ added instead of N$_2$O, in order to obtain the nitride-like N-SIPOS layer. SIPOS passivation is complete when the N-SIPOS layer has a thickness of approx. 0.1 μm.

There now remain the contact apertures and then the electrodes 11 and 12 to be generated. To do so, the SIPOS passivation layer is covered with a positive photoresist (not shown) which is then exposed through a mask M4 (FIG. 2g). After development of the photoresist, first the N-SIPOS layer is etched off with the aid of hot phosphoric acid. This etchant stops at the O-SIPOS layer. The photoresist is now removed, and the N-SIPOS layer is used as the etching mask for the O-SIPOS layer. Etching of the latter is achieved with an etchant as typically used for silicon, for example a mixture of HF and HNO$_3$ (FIG. 2h). If the SIPOS passivation layer had been directly deposited onto the entire semiconductor surface, the semiconductor layer would have been attacked too during structured etching-off of the O-SIPOS layer. The SiO$_2$ layer however acts as an etching preventer. Structured etching-off of the SiO$_2$ layer is achieved with the aid of buffered hydrofluoric acid that does not attack the semiconductor material. The contact apertures can however also be generated by a plasma etching process, for example. After uncovering in this manner the semiconductor regions to be provided with contacts, the electrodes 10 and 11 are manufactured by the known process of vapor deposition of aluminum with subsequent photolithographic structuring. In this way, the component in accordance with the diagrammatic sectional view in FIG. 1a is obtained.

Figure 2C:
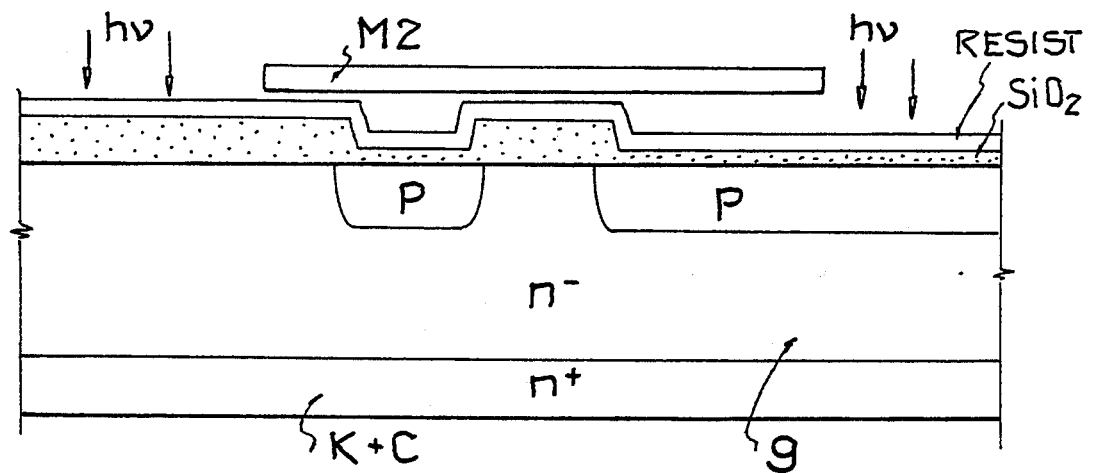
Figure 2D:
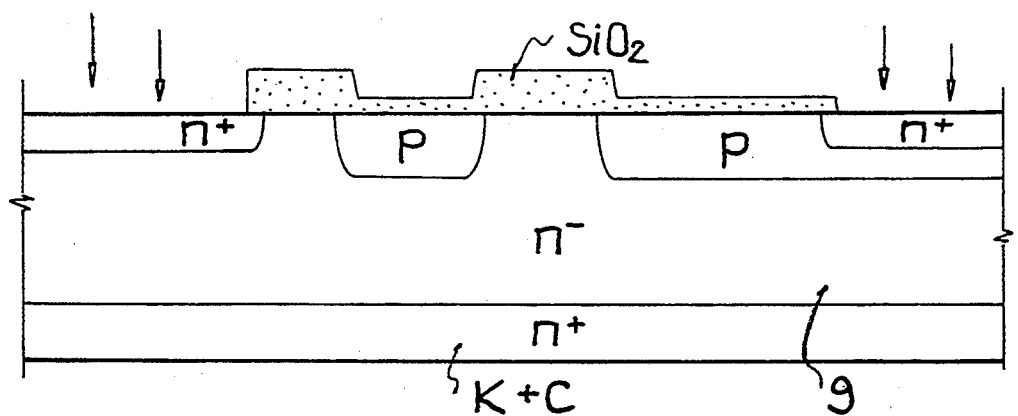
Figure 2E:
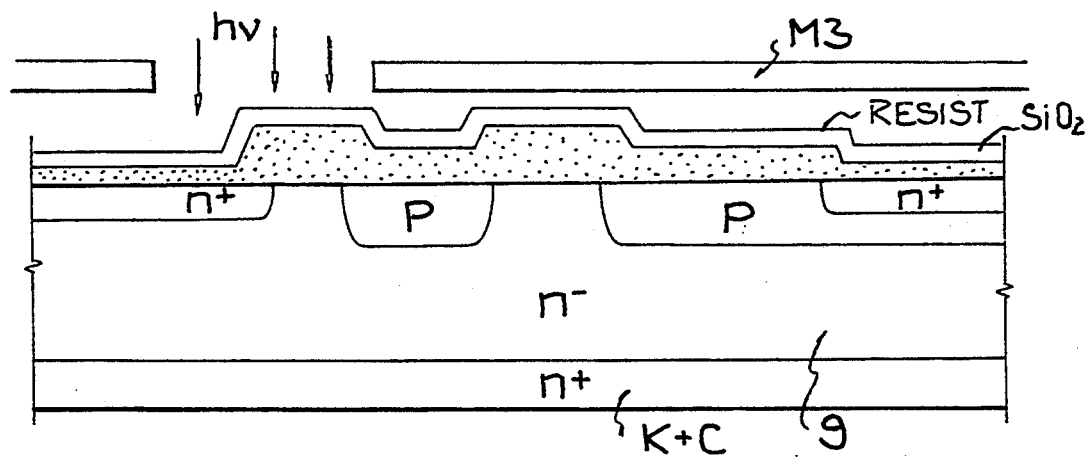
Figure 2F:
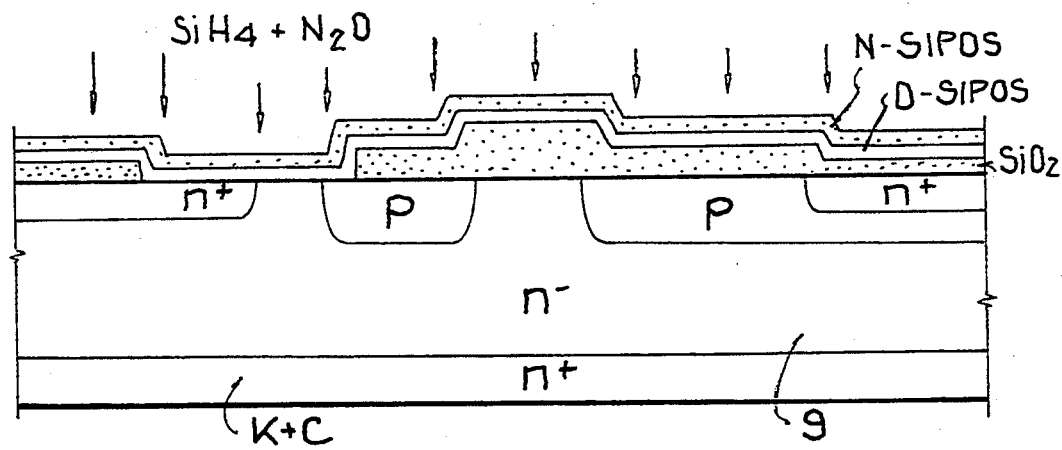
Figure 2G:
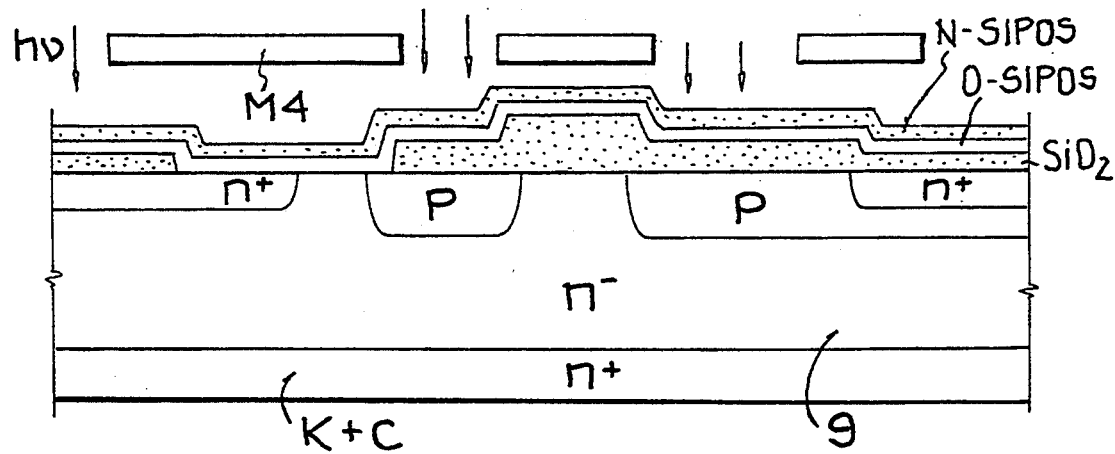
Figure 2H:
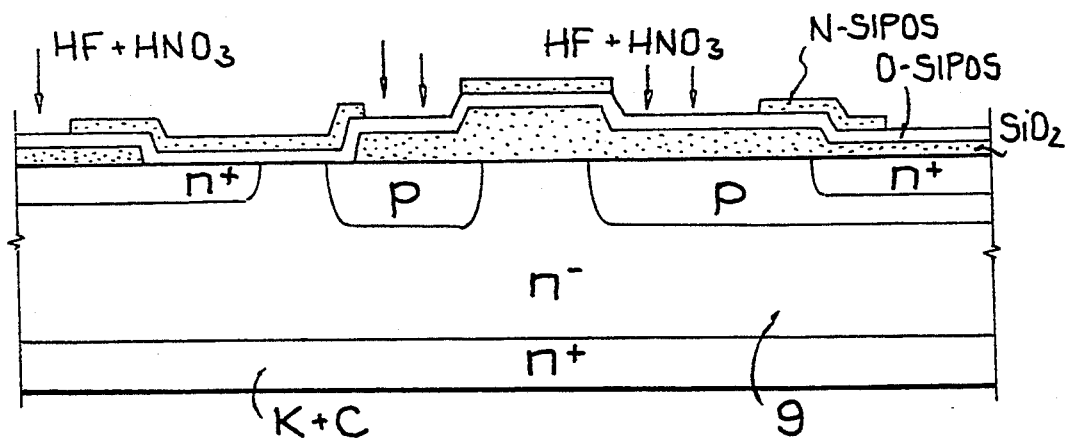
Figure 3:
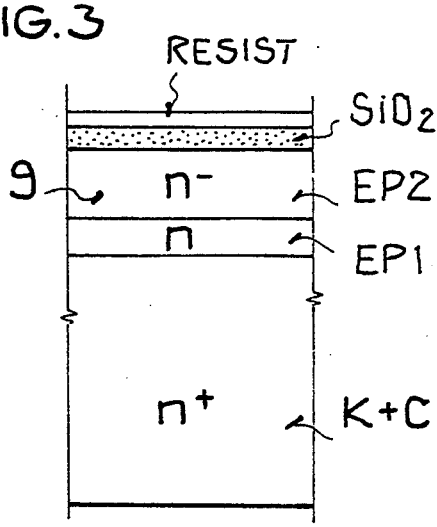
FIG. 3 is a diagram matching that of FIG. 2a, however for illustration of an epitaxy process.

In accordance with FIG. 2a, a commercially available n$^-$ substrate (approx. 1·10$^{14}$ cm$^{-3}$) with n$^+$ doped back surface layer (approx. 5·10$^{19}$ cm$^{-3}$) formed the starting material. Alternatively, as shown in FIG. 3, a commercially available n$^+$ epitaxial substrate (approx. 2-3·10$^{18}$ cm$^{-3}$) can serve as the lower component region K+C, onto which a first epitaxy layer EP1 of n Si and a second epitaxy layer EP2 of n$^-$ Si can be deposited. The second epitaxy layer EP2 represents here the upper component region 9, into which the semiconductor structures described above are diffused. This altered layer sequence has no effect whatever on the manufacturing process described.

In the component according to FIG. 1a, the breakdown voltage of the Z diode Z is determined by the distance w between the channel stopper region CS and the anode region A. The steps by which this distance is determined in the manufacturing process is set forth in detail on the basis of FIG. 4.

Figure 4:
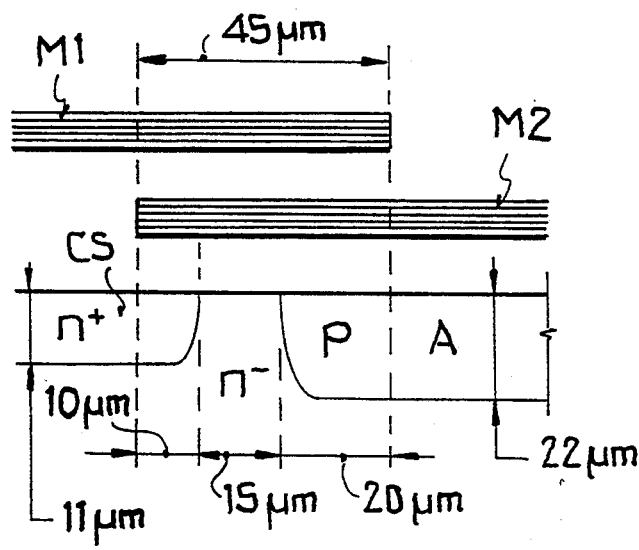
FIG. 4 is a diagram based on FIGS. 2a and 2c, explaining how the distance between an anode region and a channel stopper region is set with the aid of a predetermined mask overlap.

FIG. 4 shows, at the very top, the left-hand part of the mask M1, as is also illustrated in FIG. 2a. When the positive photoresist is exposed through this mask M1, the exposure process shown in FIG. 4 also takes effect slightly to the left, i.e. underneath the mask. Subsequent diffusion in accordance with FIG. 2b also affects the point considered in FIG. 4 towards the left, i.e. underneath the SiO$_2$ protective layer (in FIG. 2b). Overall, this leads, in the case of a 22 μm deep anode region A, to the left-hand edge of this region being some 20 μm further to the left than would correspond to the right-hand edge of the mask M1. The same applies, but in reversed form, for generation of the channel stopper region CS with the aid of the mask M2, shown underneath the mask M1 in FIG. 4. In the case of an 11 μm deep channel stopper region CS, its right-hand edge is displaced about 10 μm to the right in relation to the left-hand end of the mask M2.

In the embodiment, the masks M1 and M2 overlapped by 45 μm, leading to a distance w of 45 μm−20 μm−10 μm=15 μm on account of the aforementioned edge displacements. With n$^-$ doping of $1 \times 10^{14}$ cm$^{-3}$ (specific resistance about 43 Ωcm), this distance would result in a breakdown voltage of 400 V with a production tolerance of ±5%. By varying the mask overlap—or the doping depth and hence the edge displacement—the required breakdown voltage can be adjusted as required.

Figure 5:
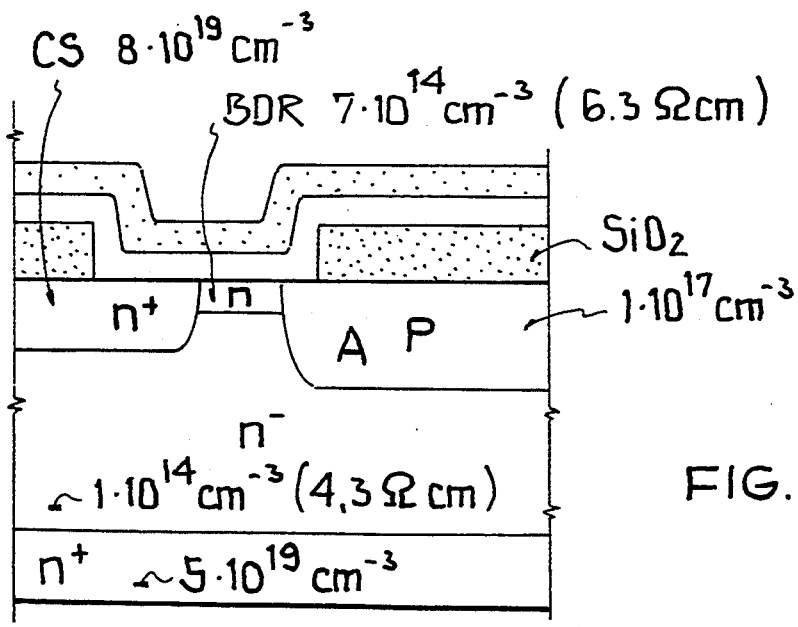
FIG. 5 is a diagrammatic partial cross-section through a planar semiconductor component having a semiconductor region of reduced specific resistance between a channel stopper region and an anode region.
Figure 7A:
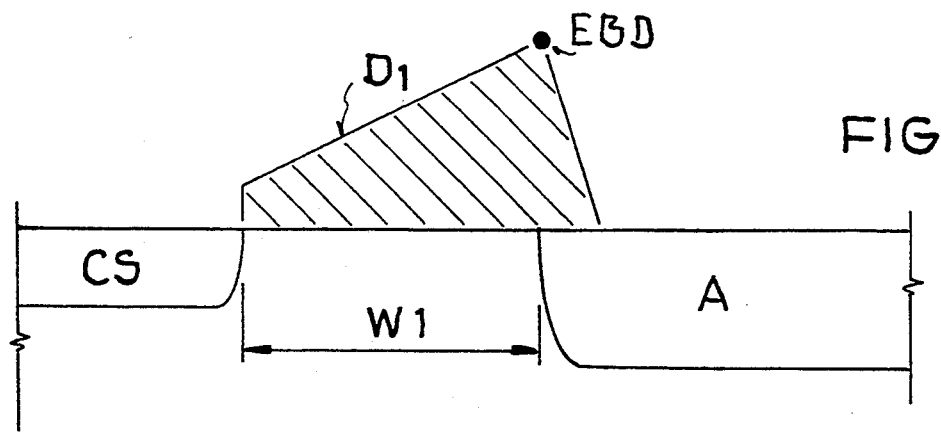
FIGS. 7a to 7d are diagrams to illustrate the function of semiconductor components in accordance with the invention.
Figure 7B:
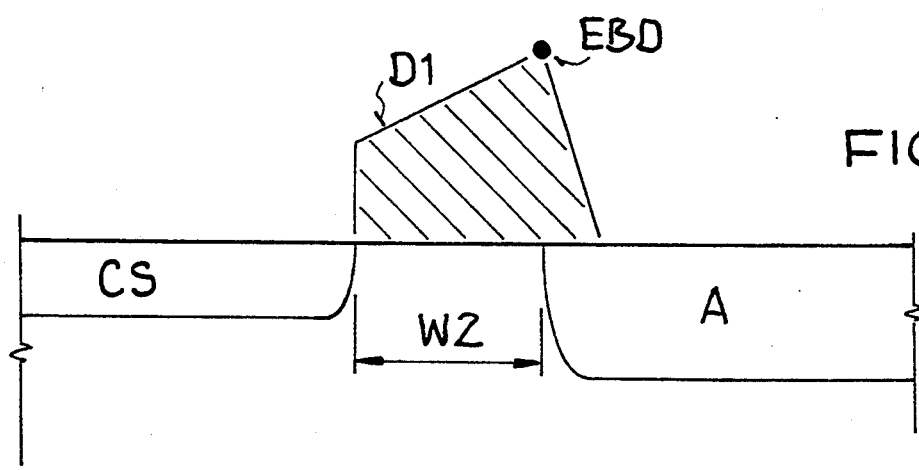
Figure 7C:
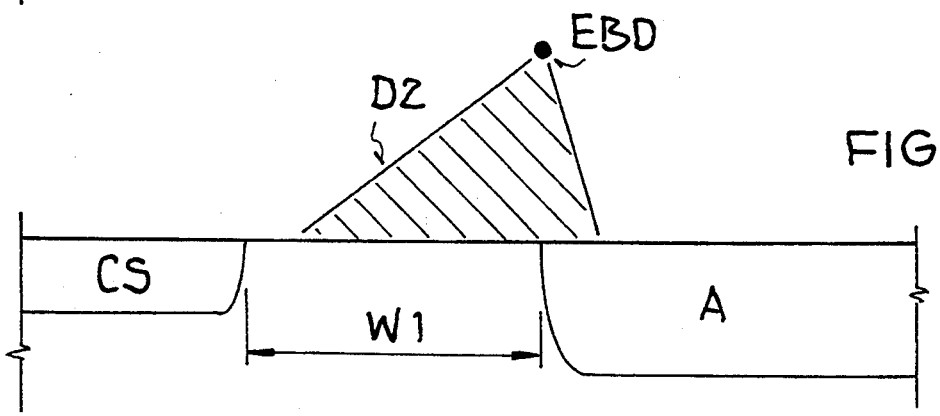
Figure 7D:
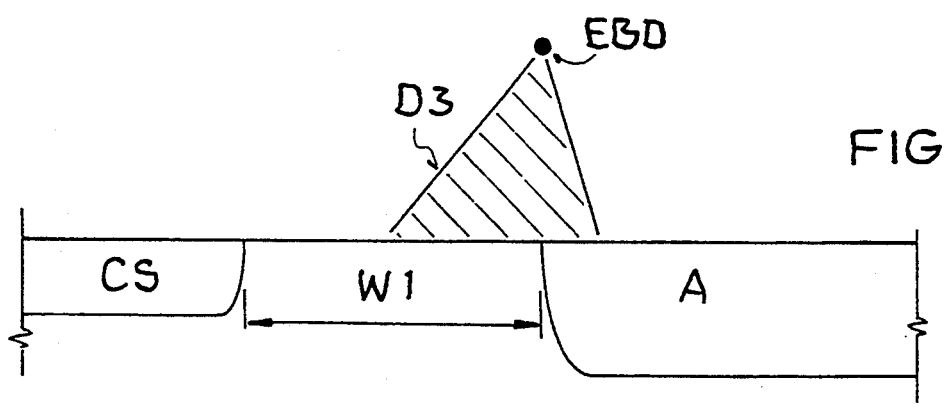

FIG. 5 shows a structure in which the breakdown voltage is adjusted not only using the distance w between the channel stopper region CS and the anode region A, but also by variation of the specific resistance in a breakdown region BDR between the regions just mentioned, which breakdown region is manufactured directly underneath or very close to the semiconductor surface by further lightly doping the n$^{--}$-doped upper component region 9. The n doping in the breakdown region BDR is in the embodiment $7 \times 10^{14}$ cm (6.3 Ωcm), compared with $1 \times 10^{14}$ cm$^{-3}$ (43 Ωcm) in the upper component region. This reduces the breakdown voltage to about 330 V.

Figure 6:
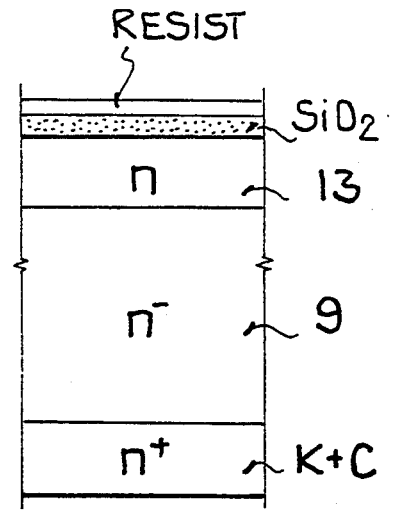
FIG. 6 is a diagrammatic view matching that of FIG. 2a, however for describing a process for manufacturing the semiconductor component in accordance with FIG. 5.

FIG. 6 illustrates the structure corresponding to FIG. 2a that must be taken as the starting point for obtaining the component in accordance with FIG. 5. The structure of FIG. 6 has, unlike that of FIG. 2a, a thin n-doped layer 13 in addition, which then leads to the breakdown region BDR. This layer is also present in the region between the anode region and the base region, directly underneath the semiconductor surface, in the finished component.

FIGS. 7a to 7d show the curvature of the electrical field between anode A and channel stopper CS for four different instances, in each case just before the breakdown field strength EBD is reached, the latter being substantially equal for all cases. The voltage between the two regions is given by the path integral of the field strength, shown as a hatched region in the figures.

In cases a) and b), the same doping D1 applies, i.e. that of the upper component region 9, in the area between the two regions. However, in case a) there is a distance w1 and in case b) a shorter distance w2. It can be directly seen that in case b) the aforementioned path integral and hence the breakdown voltage is lower than in case a). The breakdown voltage could also be adjusted using the doping and hence the rise of the field strength line.

In cases c) and d), the distance w1 applies both times, however the doping is so heavy here that the channel stopper is outside the space charge zone around the anode. The breakdown voltage is therefore no longer dependent on the distance between these two regions. In case d), however, the doping D3 is heavier than the doping D2 in case c). It can easily be seen that with heavier doping, the aforementioned path integral and hence the breakdown voltage is lower.

FIG. 7 shows clearly that the breakdown voltage can be set using the distance w, the doping D, or both of these.

It should be pointed out that the semiconductor starting material can have further regions besides the upper component region 9 and the lower component region K+C, e.g. the epitaxial region EP1 in accordance with FIG. 3. Further regions to those described above can be diffused into the upper component region 9, e.g. a further p region in the upper n+ region in the case of a thyristor. Instead of an N-SIPOS layer, one of $Si_3N_4$ can be provided. In addition to the Z diode, numerous other components can be formed in the planar semiconductor component. The only essential feature is that one of these components has a heavily doped layer having the conductivity type opposite to that used for the upper diode region. In this case, not a single additional process step is necessary for setting the breakdown voltage of the Z diode; it is only necessary to ensure that a channel stopper region adjacent to the upper diode region is manufactured at the same time as the heavily doped region described above, with the distance and/or doping being maintained between these two regions such that the breakdown voltage is determined thereby. If particular doping is to be provided between the two regions, for example in the form of the thin n layer 13, this does entail an additional process step, but this is an extremely simple doping step without any structuring requirement.

What is claimed is:

1. A planar semiconductor device having a heavily doped channel stopper region of the first conductivity type and at least the following components:
    a Zener diode having the following regions, seen from an upper surface of the device,
    an upper diode region of the second conductivity type,
    a lightly doped first upper component region, of the first conductivity type, in which said upper diode region and said channel stopper region are formed at said upper surface, and
    a heavily doped lower component region of the first conductivity type; and
    a component having
    a second upper component region, formed with said upper diode region in said first upper component region at said upper surface and having the same conductivity type as said upper diode region,
    said first upper component region,
    said lower component region, and
    a third upper component region of the same conductivity type as said channel stopper region and formed in said second upper component region at said upper surface of the device;
    wherein said channel stopper region is formed adjacent to but spaced from said upper diode region; and
    wherein a semiconductor region extending between said upper diode region and said channel stopper region has at least one of a length and a specific resistance which is dimensioned, relative to a length and a specific resistance of a semiconductor region between said upper diode region and said lower component region, such that a charge carrier breakdown of said Zener diode takes place between said upper diode region and said channel stopper region.

2. A semiconductor device according to claim 1, wherein said semiconductor upper surface is directly covered in its section between said upper diode region and said channel stopper region by an oxygen-doped Semi-Insulating Polycrystaline Silicon (O-SIPOS) layer.

3. A semiconductor device according to claim 2, wherein said O-SIPOS layer is covered by a nitrogen-doped SIPOS (N-SIPOS) layer.

4. A semiconductor device according to claim 1, wherein a breakdown region is formed between said upper diode region and said channel stopper region in said first upper component region and has a specific resistance lower than that of any adjacent portion of said first upper component region.

5. A semiconductor device according to claim 1, wherein: said upper diode region forms the anode of said Zener diode, said lower component region forms the cathode of said Zener diode and the collector of a transistor second upper component region forms the base and said third upper component region forms the emitter of said transistor.

6. A semiconductor device according to claim 1, wherein said upper diode region and said second upper component region are formed of a single semiconductor region.

7. A semiconductor device according to claim 1, wherein said first upper component region is $n^-$-doped, said upper diode region and said second upper component region are p-doped, and said third upper component region, said channel stopper region and said lower component region are $n^+$-doped.

* * * * *